(12) United States Patent
Charpin-Nicolle (10) Patent No.: US 8,906,765 B2
(45) Date of Patent: Dec. 9, 2014

(54) METHOD OF MAKING A NON-VOLATILE DOUBLE GATE MEMORY CELL

(71) Applicant: Commissariat a l'Energie Atomique et aux ene Alt, Paris (FR)

(72) Inventor: Christelle Charpin-Nicolle, Fontanil-Cornillon (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 83 days.

(21) Appl. No.: 13/736,578

(22) Filed: Jan. 8, 2013

(65) Prior Publication Data
US 2013/0181273 A1 Jul. 18, 2013

(30) Foreign Application Priority Data
Jan. 9, 2012 (FR) .................. 12 50205

(51) Int. Cl.
| H01L 21/336 | (2006.01) |
| H01L 29/66 | (2006.01) |
| H01L 29/423 | (2006.01) |
| H01L 21/28 | (2006.01) |
| H01L 29/788 | (2006.01) |
| H01L 29/792 | (2006.01) |

(52) U.S. Cl.
CPC ...... *H01L 29/66825* (2013.01); *H01L 29/4234* (2013.01); *H01L 21/28273* (2013.01); *H01L 29/66833* (2013.01); *H01L 29/788* (2013.01); *H01L 29/792* (2013.01); *H01L 21/28282* (2013.01)
USPC .................... 438/267; 257/316; 257/E21.682

(58) Field of Classification Search
USPC .......................... 438/265, 267, 596; 257/320
See application file for complete search history.

(56) References Cited

U.S. PATENT DOCUMENTS

| 2,381,471 A | 8/1945 | John W. Teter |
| 4,868,929 A | 9/1989 | Curcio |
| 5,768,192 A | 6/1998 | Eitan |
| 7,130,223 B2 | 10/2006 | Ishimaru et al. |

(Continued)

FOREIGN PATENT DOCUMENTS

| EP | 2 381 471 A1 | 10/2011 |
| FR | 10 53076 | 4/2010 |
| FR | 10 60023 | 12/2010 |
| JP | 2011-187562 | 9/2011 |

OTHER PUBLICATIONS

U.S. Appl. No. 13/736,524, filed Jan. 8, 2013, Charpin-Nicolle, et al.

(Continued)

*Primary Examiner* — Chandra Chaudhari
(74) *Attorney, Agent, or Firm* — Oblon, Spivak, McClelland, Maier & Neustadt, L.L.P.

(57) ABSTRACT

A method of making a non-volatile double-gate memory cell. A gate of the control transistor is formed with a relief on a substrate. A control gate of the memory transistor is formed with a layer of a semiconductor material covering relief. The method includes chemical mechanical polishing (CMP) so as to strip, above the relief another layer and part of the layer of a semiconductor material; stripping of the remaining other layer on both sides of the relief, etching of the layer of a semiconductor material so as to strip this material above the relief and to leave only a pattern on at least one sidewall of the relief.

21 Claims, 7 Drawing Sheets

(56) References Cited

U.S. PATENT DOCUMENTS

| | | | |
|---|---|---|---|
| 7,235,441 B2* | 6/2007 | Yasui et al. | 438/257 |
| 7,268,042 B2* | 9/2007 | Hisamoto et al. | 438/267 |
| 8,252,702 B2 | 8/2012 | Molas et al. | |
| 8,592,275 B2* | 11/2013 | Kawashima | 438/266 |
| 2004/0207025 A1 | 10/2004 | Chiba et al. | |
| 2005/0121715 A1 | 6/2005 | Jeng | |
| 2007/0228498 A1 | 10/2007 | Toba et al. | |
| 2010/0078706 A1 | 4/2010 | Matsuda | |
| 2010/0264479 A1 | 10/2010 | Toba et al. | |
| 2011/0300699 A1 | 12/2011 | Molas et al. | |
| 2012/0139025 A1 | 6/2012 | Gely et al. | |

OTHER PUBLICATIONS

Sohrab Kianian, et al., "A novel 3 volts-only, small sector erase, high density flash $E^2PROM$", Symposium on VLSI Technology Digest of Technical Papers, 6A.4, 1994, pp. 71-72.

French Preliminary Search Report and Written Opinion issued Aug. 29, 2012, in French 1250205, filed Jan. 9, 2012 (with English Translation).

\* cited by examiner

PRIOR ART

METHOD OF MAKING A NON-VOLATILE DOUBLE GATE MEMORY CELL

TECHNICAL FIELD OF THE INVENTION

The invention relates to the field of electronic memory devices or memories of non-volatile type. It has particularly advantageous application in the field of electronic memories of double-gate flash type comprising a control gate, also referred to as gate of the control transistor, and a memory gate, also referred to as control gate of the memory transistor.

PRIOR ART

There exist several types of non-volatile memories, in other words memories that preserve stored information in the absence of electrical supply and can be written and/or erased electrically:

- EPROMS, for the English "Erasable Programmable Read Only Memories", in other words "erasable and programmable (read only) permanent memories", the contents of which may be written electrically but which must be subjected to ultraviolet (UV) radiation to erase the information stored therein.
- EEPROMS, for the English "Electrically Erasable Programmable ROMs", in other words "electrically erasable and programmable permanent memories", the contents of which may be written and erased electrically but which require larger semiconductor surfaces for their production than do the memories of EPROM type, and which are therefore more costly to produce.
- Flash memories. These non-volatile memories do not have the aforesaid disadvantages of EPROM or EEPROM memories. In fact, a flash memory is formed by a plurality of memory cells that can be programmed electrically in individual manner, a large number of cells, referred to as block, sector or page, being able to be erased simultaneously and electrically. Flash memories combine the advantage of EPROM memories in terms of integration density and the advantage of EEPROM memories in terms of electrical erasure.

In addition, the durability and the low electrical consumption of flash memories makes them advantageous for numerous applications: digital photographic devices, cellular telephones, printers, personal assistants, portable computers or even portable devices for reading and sound recording, especially the so-called USB keys, for the English "universal serial bus", which are capable of connecting directly to a "universal serial bus", which has become a standard of micro information technology, and many other applications. Flash memories do not possess mechanical elements, which additionally endows them with quite good shock resistance.

Most flash memories are of "standalone" type, meaning that they are autonomous devices that have large storage capacities, generally larger than 1 gigabit or Gb (1 Gb=$10^9$ bits) and that are dedicated to mass storage applications.

There also exist so-called on-board flash memories, the production of which is integrated with that of a method, for example that known as CMOS, the English acronym for "complementary metal oxide semiconductor", the technological method most widely used by the microelectronics industry for construction of integrated circuits based on "complementary" (C) transistors of "metal oxide semiconductor" (MOS) type. These memories are finding increasing interest, for example in the automobile or microcontroller fields, for storage of data or codes. These on-board flash memories are produced on a chip that also carries CMOS circuits intended to perform logic functions other than data storage. These on-board flash memories are generally produced for storage capacities smaller than those of memories of "standalone" type, and their capacity may vary in general from several bits to several megabits or Mb (1 Mb=$10^6$ bits). The characteristics sought by on-board flash memories are low production cost, excellent reliability (especially at high temperature), low electrical consumption or even high programming speed, these characteristics being a function of the application for which they are intended.

Most of the flash memory points have a structure of MOS transistor type comprising three electrodes: source, drain and gate, the gate making it possible to create a conduction channel between source and drain. Their special feature of permitting non-volatile storage of information is that they additionally have a site for storage of electrical charges, known as a floating gate, which is formed, for example, by a layer of polycrystalline silicon disposed between two oxide layers, positioned between the electrically conductive material of the gate and the transistor channel. Storage is achieved by applying to the conductive material a voltage higher than the threshold voltage, for example between 15 volts and 20 volts, so as to store the information in the form of charges trapped by the floating gate.

However, such memories exhibit disadvantages that limit the reduction of their dimensions. In fact, a reduction of thickness of the tunnel oxide disposed between the channel and the layer of polycrystalline silicon constituting the floating gate leads to an increase of the SILC, the English acronym for "stress induced leakage current", denoting the "leakage current induced by stress". The prolonged use of such a memory, in other words the repetition of write and erasure cycles, eventually generates defects in the tunnel oxide, which tend to evacuate the charges trapped in the floating gate. Similarly, a large SILC or leakage current affects the retention time of the charges in the floating gate. In practice, it is therefore difficult to reduce the thickness of the tunnel oxide of these memories to smaller than 8 nanometers or nm (1 nm=$10^{-9}$ meter) without allowing the SILC to become a critical phenomenon for storage. In addition, by reducing the dimensions of such a memory cell, the parasitic coupling between the floating gates of two adjacent cells of the same memory becomes large and may therefore degrade the reliability of the memory.

For these reasons, memories of MONOS type (Metal Oxide Nitride Oxide Silicon), also known as NROM memories, have been proposed in order to replace the memories with floating gate of polycrystalline silicon. The document U.S. Pat. No. 5,768,192 describes such memories, in which the electrical charges are stored in traps formed in a floating gate composed of nitride and disposed between two oxide layers. In such a nitride layer, the traps are isolated from one another. Thus an electron stored in one of the traps remains physically localized in this trap, thus making these memories much less sensitive to the defects in the tunnel oxide and therefore less impacted by an increase of the SILC. In fact, in the presence of a defect in the tunnel oxide, the memory layer, in other words the nitride layer, loses only the electrons situated close to the defect, the other trapped electrons not being affected by this defect. These memories therefore have better reliability. In this way it is possible to have a tunnel oxide of thickness smaller than approximately 8 nm and therefore to lower the necessary programming voltages. In addition, because of the small thickness of the nitride for forming the memory layer, the coupling between two adjacent memory cells is greatly reduced compared with cells with floating gate of polycrystalline silicon. Finally, the structure of a memory of NROM type is also suitable for producing on-board memories, by virtue of the simplicity of the method for integration of these memories.

The document of S. Kianian and co-authors, "A novel 3 volt-only, small sector erase, high density flash E$^2$PROM", Technical Digest of VLSI Technology, 1994, p. 71", describes another type of memory, known as "split-gate" memory, in other words a memory with "shared gate", which combines, within the same memory cell, a memory transistor and a selection transistor (or control transistor) formed on a single active zone. Such a double-gate memory cell is generally programmed via injection of carriers by the source, a mechanism that requires the presence of a selection transistor joined to the memory transistor, and that makes it possible to increase the programming speed while reducing the consumption compared with a memory of NROM type.

In order to benefit from the advantages of each of the structures hereinabove, in other words: split-gate and NROM, the document US 2004/207025 proposes another type of double-gate memory combining the two structures. One of the difficulties for producing these memories then concerns the control of the relative position of the gates, the gate of the control transistor and the control gate of the memory transistor relative to one another. In fact, these gates are produced by two successive lithographic operations, the disalignment of the second gate relative to the first gate fixing the length of the second gate. Poor control of the relative positions of the two gates therefore translates into poor control of the electrical characteristics of the second transistor and of its electrical performances, and therefore potentially poor electrical performances of the memory. Consequently very precise control of the position of the gates is necessary during the production of this type of memory.

In order to become free of this alignment constraint, the document U.S. Pat. No. 7,130,223 also proposes to produce a double-gate memory combining the structure of a memory of NROM type with split-gate architecture. However, the control gate of the memory transistor, in other words the gate containing the data memorization layer, is produced in this case in the form of a lateral spacer of the gate of the control transistor, which is disposed against one of the two lateral sidewalls of the gate of the control transistor. Such a structure makes it possible to control the position and the dimension of the control gate of the memory transistor precisely relative to the gate of the control transistor. In fact, since the control gate of the memory transistor is produced in the form of a lateral spacer of the gate of the control transistor, it then becomes self-aligned on the latter.

Figure 1A:
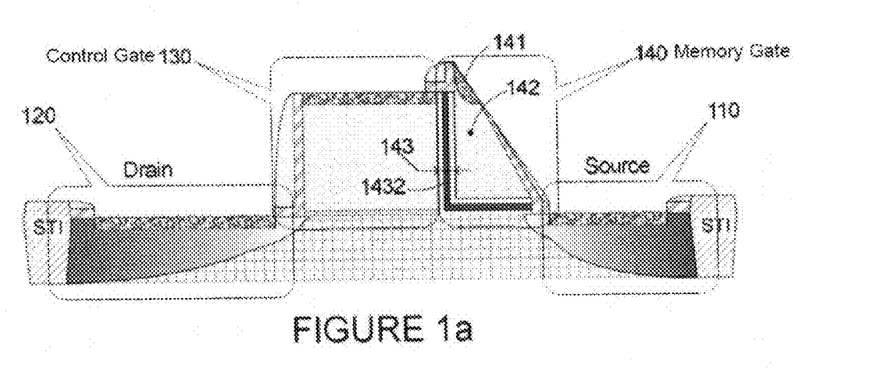
FIGS. 1a and 1b illustrate the double-gate memory cells of the prior art.

Nevertheless, with such a structure, it is very difficult then to achieve definition of an electrical contact area on the control gate of the memory transistor, in view of the small dimensions of this gate in the form of a lateral spacer. This problem is illustrated in FIG. 1. FIG. 1*a* shows a view in section of an example of such a double-gate memory cell. Between source and drain zones 110 and 120 there are disposed the two gates shared by a same cell. As mentioned hereinabove, control gate 140 of the memory transistor, also known as memory gate 140, is produced on source side 110 in the form of a spacer of gate 130 of the control transistor and because of this is self-aligned thereon. Gate 130 of the control transistor, also known as control gate 130, which is comparable to that of a simple transistor of MOS type, may be produced in traditional manner by diverse means and methods known to the person skilled in the art. In FIG. 1*a*, it is seen that surface 141, which makes it possible to establish electrical contact with control gate 140 of the memory transistor, is particularly limited in the case of a spacer of triangular shape. Such a shape results most naturally from the formation of the spacer with the means and methods known to the person skilled in the art, so that the assembly of layers constituting the control gate of the memory transistor is self-aligned on gate 130 of the control transistor. Contact surface 141 corresponds to the silicidation of the underlying material, which is polycrystalline silicon 142 and which constitutes the main part of the volume of the control gate of the memory transistor. The memory capability is typically achieved by means of a stack or sandwich of layers 143 containing a layer for trapping electrical charges. This trapping layer constitutes the floating gate, which functions to trap the charges that memorize the state of the memory cell in the control gate of the memory transistor, as described in the foregoing.

Figure 1B:
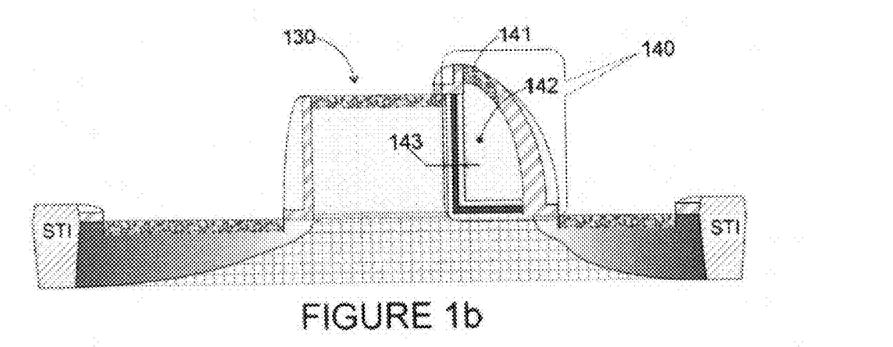

FIG. 1*b* shows a view in section of another example of such a double-gate memory cell, in which contact surface 141 of the control gate of the memory transistor is enlarged by endeavoring to obtain the most rounded possible shape of the spacer. Nevertheless, this type of shape is difficult to obtain by using the methods of microelectronics, especially with polycrystalline silicon 142, a material which constitutes the main part of the control gate of the memory transistor.

Defining a contact area on the control gate of the memory transistor is very difficult to employ in the scope of an industrial process, and in particular calls for very constraining positioning specifications so that the connecting vias, in particular those for connecting the control gate of the memory transistor, are always well positioned. A defect of positioning of the vias would prevent the cell from functioning and in particular could create a short circuit between the gate of the control transistor and the control gate of the memory transistor.

One object of the present invention is therefore to propose a new memory cell structure or a new method making it possible to facilitate defining a contact area on each of the gates and to limit the risks of short circuit.

The other objects, characteristics and advantages of the present invention will become apparent upon examination of the description hereinafter and of the accompanying drawings. It is understood that other advantages may be incorporated.

SUMMARY OF THE INVENTION

To achieve this objective, one aspect of the present invention relates to a method of making a non-volatile double-gate memory cell comprising a control transistor comprising a control transistor comprising a gate and a memory transistor comprising a control gate adjacent to the gate of the control transistor, wherein there take place the following steps: forming at least partly the gate of the control transistor, comprising in particular obtaining a relief of a preferably semiconductor material on a substrate; forming the control gate of the memory transistor, preferably comprising a step of depositing a layer of a preferably semiconductor material so as to cover the relief of the gate of the control transistor at least.

The formation of the control gate of the memory transistor additionally comprises the steps of:

depositing, on the layer of a semiconductor material, another layer. The thickness of this other layer is preferably such that the upper face of the said other layer is situated at all points above the relief of the gate of the control transistor;

preferably, chemical mechanical polishing CMP performed so as to strip, above the relief of the gate of the control transistor, the said other layer and part of the layer of a semiconductor material;

preferably, stripping of the remaining said other layer on both sides of the relief of the gate of the control transistor, etching of the layer of a semiconductor material so as to strip this material above the relief of the gate of the control transistor and to leave in existence a pattern only on at least one sidewall of the relief of the gate of the control transistor.

In this way the bottom of the difference of levels of the other layer is at a level equal to or higher than the tops of the difference of levels of a semiconductor material. The said other layer therefore makes it possible, during the step of chemical mechanical polishing, to strip a substantial part of the polycrystalline silicon layer situated above the pattern without for all that, stripping this layer on the sidewalls of the relief of the gate of the control transistor. The width of the pattern forming a spacer is therefore increased.

The contact surface of the control gate of the memory transistor formed starting from this pattern is therefore significantly extended. The positioning of the contact gate relative to a via for connection with the upper circuitry layers is therefore facilitated.

Furthermore, the volume of material subsequently accessible and available for performing silicidation is also increased, thus making it possible to improve the electrical connection between the gate of the control transistor and the circuitry layers.

Another aspect of the invention relates to a memory cell obtained according to the method according to any one of the preceding claims.

BRIEF DESCRIPTION OF THE FIGURES

The objectives, objects, as well as the characteristics and advantages of the invention will become more apparent from the detailed description of an embodiment thereof illustrated in the accompanying drawings hereinafter, wherein:

FIG. 3, which comprises FIGS. 3a to 3f, illustrates the additional steps that complete the formation of the control gate of the memory transistor of a double-gate memory cell.

The attached drawings are given by way of examples and are not limitative of the invention.

DETAILED DESCRIPTION OF THE INVENTION

It is recalled that one of the objectives of the invention is to obtain a broader zone for defining a contact area, thus making it possible to position a via for connection with the upper circuitry layers more easily on the control gate of the memory transistor.

It is clarified that, within the scope of the present patent application, the term "on" does not necessarily mean "in contact with". Thus, for example, the deposition of a layer of polysilicon on a layer of insulator does not necessarily mean that the layer of polysilicon is directly in contact with the layer of insulator but that means that it covers it at least partly, either by being directly in contact therewith or by being separated therefrom by another layer or another element.

Before beginning a detailed review of embodiments of the invention, optional characteristics that may be used in association or alternatively if applicable are listed below:

Advantageously, the step of chemical mechanical polishing comprises a first step of chemical mechanical polishing carried out so as to planarize the surface of the said other layer or to keep it as plane as possible.

In yet more advantageous manner, the step of chemical mechanical polishing comprises a second step of chemical mechanical polishing carried out so as to reduce the thickness of the layer of a semiconductor material situated above the relief of the gate of the control transistor.

Advantageously, the step of chemical mechanical polishing is carried out so as to strip at least 20% of the thickness of the layer of a semiconductor material. Preferably, the step of chemical mechanical polishing carried out so as to strip at least 40% of the thickness of the layer of a semiconductor material. Preferably, between 40% and 60% of the thickness of the layer of a semiconductor material is stripped in the course of this step.

Preferably, the etching step comprises in particular an anisotropic etching of the layer of a semiconductor material. This anisotropic etching is directed perpendicular to the plane of the substrate, in other words vertically and toward the bottom in the figures of the illustrated example.

Preferably, the step of anisotropic etching is carried out so as to preserve, above the relief of the gate of the control transistor, a thickness of the layer of a semiconductor material greater than 5 nm and preferably between 5 and 10 nm.

Preferably, the etching step comprises, after the anisotropic etching, an isotropic etching of the remaining layer of a semiconductor material, with stopping of the etching on an upper oxide layer and wherein the upper oxide layer is disposed on the relief of the gate of the control transistor prior to the deposition on the layer of a semiconductor material.

Advantageously, the step of depositing the layer of a semiconductor material is carried out so that its thickness is between 0.2 and 0.8 times the thickness of the relief partly forming the gate of the control transistor. In yet more advantageous manner, the thickness of the layer of a semiconductor material is between 0.3 and 0.6 times the thickness of the relief partly forming the gate of the control transistor. In yet more advantageous manner, the thickness of the layer of a semiconductor material is substantially equal to half the thickness of the silicon of the relief partly forming the gate of the control transistor. This thickness makes it possible to have a clear discontinuity between the top of the relief overlaid with the layer of a semiconductor material and this same layer outside the relief. In any case, the thickness of the layer of semiconductor material as deposited is smaller than the height of the gate of the control transistor. Thus, outside the gate of the control transistor, the upper face of the layer of semiconductor material is situated below the top of the gate of the control transistor.

Advantageously, the thickness of the layer of a semiconductor material is smaller than the thickness of the said other layer.

Preferably, the step of depositing the layer of a semiconductor layer is conforming, the thickness of the layer of a semiconductor material being substantially constant even in the presence of patterns.

Preferably, the step of depositing the said other layer is carried out so that its thickness is greater than the thickness of the relief partly forming the gate of the control transistor. Preferably, the thickness of the said other layer is greater than 1.1 and still more preferably 1.3 times the thickness of the relief partly forming the gate of the control transistor. Advantageously, the thickness of the said other layer is greater than the thickness of the relief formed by the relief and the stack of layers comprising the trapping layer.

Advantageously, the relief of the gate of the control transistor is of silicon. Preferably, the relief of the gate of the control transistor is of polycrystalline silicon.

Advantageously, the layer of a semiconductor material is of polycrystalline silicon.

Advantageously, the said other layer is of $SiO_2$.

Advantageously, the control gate of the memory transistor forms a spacer for the gate of the control transistor.

Advantageously, the formation of the control gate of the memory transistor is carried out such that the control gate of the memory transistor is self-aligned with the gate of the control transistor.

Preferably, prior to the step of depositing the layer of a semiconductor material, a step of forming a stack of layers configured to store electrical charges on at least one sidewall of the relief of the gate of the control transistor and at least one part of the substrate, the stack of layers comprising two layers of electrical insulator fitting around an intermediate layer for trapping of charges.

Preferably, the method comprises a step of silicidating an upper surface of the pattern.

FIG. 2, which comprises FIGS. 2a to 2e, illustrates the steps of an example of the method according to the invention that makes it possible to obtain a larger contact surface on the memory transistor and more precisely on the control gate of the memory transistor.

Figure 2A:
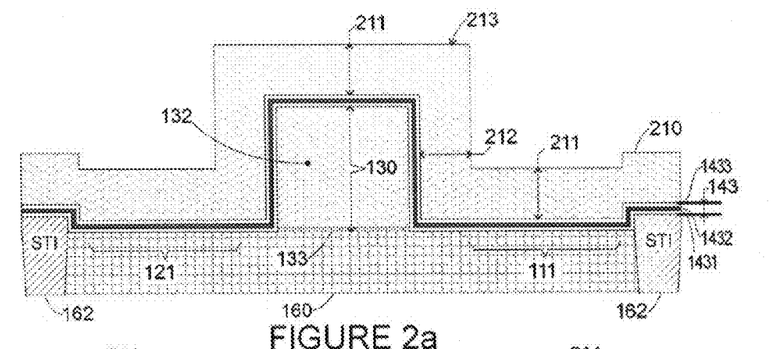
FIG. 2, which comprises FIGS. 2a to 2h, describes steps of the method according to the invention that make it possible to achieve definition of a much broader contact area on the control gate of the memory transistor of a double-gate memory cell.

FIG. 2a is a view in section, similar to that of FIG. 1a, of a double-gate memory cell at a stage of the manufacturing process in which the control transistor has already been formed at least in part and in which it is ready for production of the self-aligned memory transistor without having to rely on lithography operations. It is recalled that the control transistor and the memory transistor share the same source and the same drain. They are therefore included in the same cell. This cell is usually referred to as a double-gate transistor, each of the gates making it possible to perform the function of the transistor, either control or memory, to which it is dedicated. Up to this stage, the manufacture of such a memory cell is carried out by using the conventional methods and means employed by the microelectronics industry, especially those for the manufacture of transistors of MOS type. In a standard manner, these transistors, just as the double-gate memory cells of the invention, are each manufactured in a well 160 of monocrystalline silicon. The wells are electrically isolated from one another by trenches 162, typically of silicon oxide. The formation of these trenches relies on a technique known as STI, from the English "shallow trench isolation", in other words "isolation by trenches of little depth". Trenches 160 of monocrystalline silicon are in fact most often formed from the thin surface layer of monocrystalline silicon of a prepared substrate of SOI type, from the English "silicon on insulator", in other words a "silicon on insulator" substrate. This layer of monocrystalline silicon is itself placed above a "buried oxide layer", most often referred to by its acronym BOX, from the English "buried oxide layer". Each well is therefore completely electrically isolated from its neighbors, laterally and at the bottom, by the oxide. Although not necessary for understanding of the method of the invention, it will be noted that there are represented only the surface layer and lateral trenches 162 in which wells 160 are formed. Furthermore, the employment of an SOI substrate is only one particular example of use. Other means and methods may be used so that a double-gate memory cell employing the method described hereinafter can be produced in an isolated well 160 and which would be obtained in a manner other than from an SOI substrate.

Gate 130 of the control transistor, the geometry of which was defined by photolithography, comprises at this stage several layers, mainly two layers, which are: the gate proper, formed by a relief 132 of semiconductor material, preferably of polycrystalline silicon; and oxide layer 133 of the MOS structure, underneath which, as a function of the voltage applied on the gate of the control transistor, a conduction channel (not represented) will be created at the surface of well 160 between source and drain zones 111 and 121 respectively, which are not yet formed at this stage. Source 111 and drain 121 will generally be obtained by ion implantation of a dopant of the monocrystalline silicon layer of isolating well 160. Since gate 130 of the control transistor functions as mask, source and drain will be self-aligned thereon, as will be seen later. At this stage it will be possible to carry out a first ion implantation (not represented) in order to adjust the conduction threshold (VT) of the control gate of the memory transistor.

FIG. 2a shows the layers that are deposited over the entirety of the devices in the course of manufacture with a view to producing the control gate of the memory transistor, in other words at the surface of a wafer of a semiconductor forming a substrate. After formation of control gates 130, layers forming the stack or sandwich of layers 143 containing the trapping layer are successively deposited. A non-limitative example of trapping layer is a layer denoted by its acronym ONO, in other words "oxide nitride oxide" of silicon. Interior layer 1432 of silicon nitride ($Si_3N_4$) constitutes the floating gate, which functions to trap the charges that memorize the state of the memory cell in the control gate of the memory transistor, as described in the foregoing. Other structures are possible. The sandwich in this example has three layers: a first layer, denoted lower layer 1431, forming an electrical insulator, most often silicon oxide or $SiO2$; a second layer, denoted intermediate layer or trapping layer 1432, serving to trap the charges intended to memorize the state of the memory cell, and typically consisting of silicon nitride or $Si_3N_4$; a third layer, denoted upper layer 1433, also forming an electrical insulator, produced, for example, from silicon oxide, as for the first layer.

A first layer 210 is then deposited. This first layer is preferably a layer of polycrystalline silicon 210. This layer 210 is intended to contribute to the formation of the control gate of the memory transistor. Preferably, the gate of the control transistor, as was seen hereinabove, is also constituted of polycrystalline silicon that was deposited and etched previously in conventional manner.

Ideally, the deposit will be as "conforming" as possible. A deposit is said to be conforming when the thicknesses deposited are the same, independently of the angle of inclination of the surfaces on which it is formed. The thickness of layer 210 is therefore substantially homogeneous at every point of the covered surface, the thickness being measured in a direction perpendicular to the surface on which the deposit is applied. Such a result may be obtained, for example with a deposition method falling within the category of those known as LPCVD, the English acronym for "low pressure chemical vapor deposition", in other words "chemical deposition in vapor phase at low pressure". As represented in FIG. 2a, it is then possible to obtain a vertical deposit thickness 211 substantially equal to horizontal thickness 212.

Figure 2B:
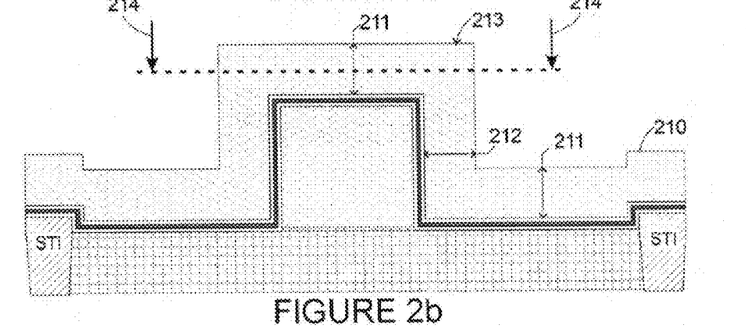

As shown in FIG. 2b, to be able to produce the control gate of the memory transistor from the polycrystalline silicon originating from layer 210 that has just been deposited, the invention provides that it must first be possible to apply "chemical mechanical polishing" of the wafer in the course of manufacture. Often denoted by the acronym CMP, for the English "chemical mechanical polishing", this polishing must affect only the part of the deposit of layer 210 corresponding to surface 213, in other words the stack of layers situated above control gates 130 of a wafer. As illustrated in FIG. 2b, this chemical mechanical polishing 214 has the objective of selectively reducing initial thickness 211 of layer 210 above the control gates of the memory cells.

Figure 2C:
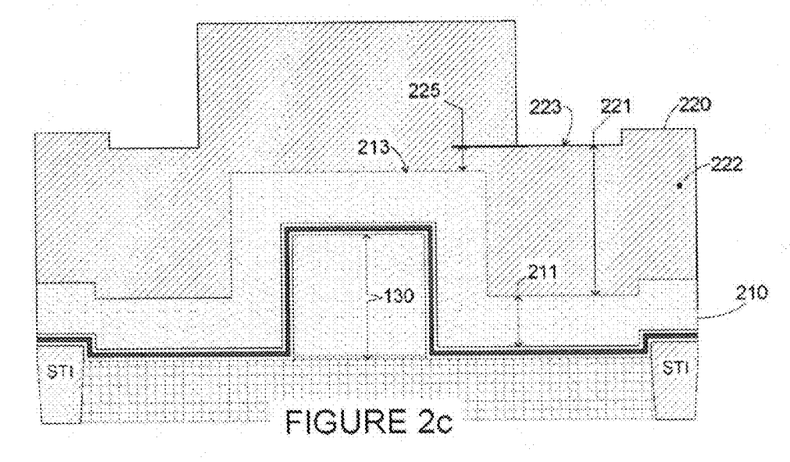

In the scope of the present invention, however, it has been proved that, in practice, this chemical mechanical polishing cannot be achieved without risk directly on layer 210, in particular because it is necessary, as will be seen later, to be able to control the stopping of the chemical mechanical polishing precisely without affecting the control gates. As shown in FIG. 2c, the method of the invention provides that another layer 220 is then deposited on layer 210, preferably made of polycrystalline silicon, before the CMP operation. This other layer 220, also denoted filling layer, is constituted, for example, of silicon oxide 222 ($SiO_2$), which can be attacked with an appropriate CMP method and easily may be removed selectively compared with the polycrystalline silicon by wet etching. To be able to achieve the CMP operation under good conditions, thickness 221 of silicon oxide layer 220 must be such that bottom 223 of the difference of levels of this layer must be situated above surface 213 corresponding to the stack of layers above control gates 130 before deposition of layer 220. In other words, distance 225 must be larger than zero. By way of non-limitative example, thickness 211 of layer 210 of polycrystalline silicon is 65 nm and thickness 221 of layer 220 of silicon oxide is 100 nm, so as to be in the configuration illustrated in FIG. 2c, in other words with a distance 225 larger than zero.

The $SiO_2$ may be deposited in different manners, for example with a deposition method of the LPCVD type already mentioned hereinabove, which makes it possible to achieve good conformity of the material, in other words a substantially constant thickness in the presence or absence of patterns. However, since the conformity aspect is not paramount for this deposit, the other methods commonly practiced by the microelectronics industry for the deposition of $SiO_2$ may also be employed.

It will be noted here that the material constituting layer 220 is a material referred to as "sacrificial," since in fact it is just intended to provide a better stopping of the CMP, and which then is eliminated. The material constituting layer 210 is that of the memory gate. $SiO_2$ traditionally is used for its ease of employment.

Figure 2D:
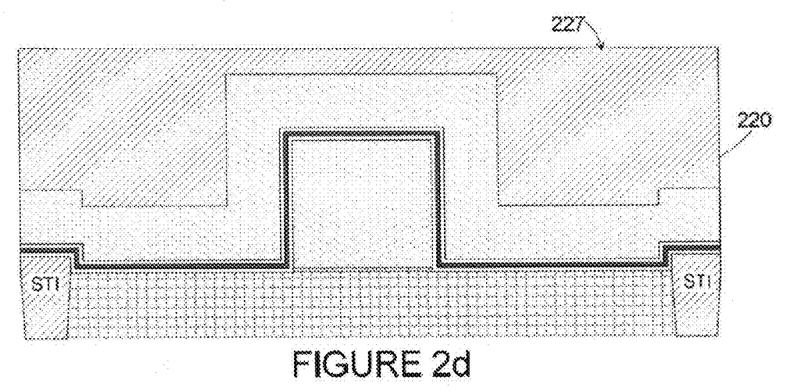

Under these conditions it will be possible to undertake a first chemical mechanical polishing, the result of which is illustrated in FIG. 2d. This first polishing can be stopped on a plane surface 227 in layer 220 of silicon oxide. The polishing is stopped "in time", knowing the rate of attack of the polishing operation.

Figure 2E:
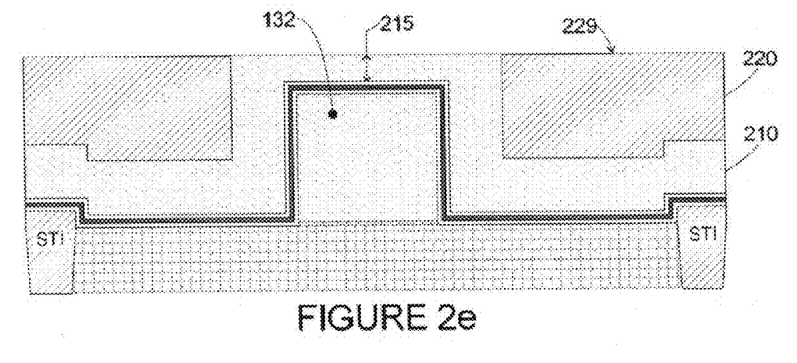

The following FIG. 2e illustrates the result of a second, slower chemical mechanical polishing, which this time is stopped on a plane surface 229 traversing layer 210 of polycrystalline silicon as far as to leave, above the control gates, a residual thickness 215 of layer 210 of polycrystalline silicon on the order of half of initial thickness 211, thus achieving the objective illustrated in FIG. 2b. This second polishing step is stopped upon detection of the underlying silicon layer.

Figure 2F:
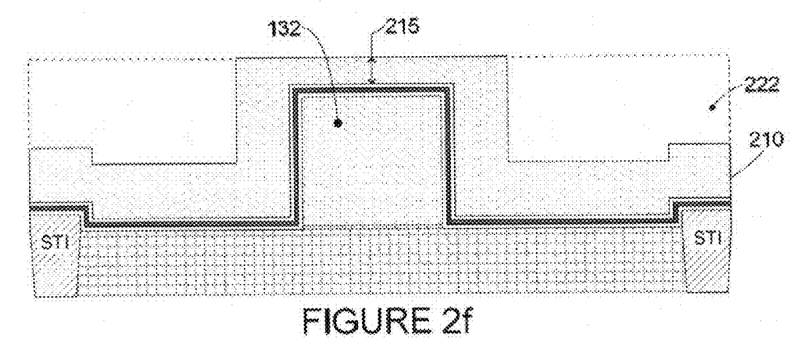

FIG. 2f shows the result of the subsequent step of the method after silicon oxide layer 222, which constituted the material of layer 220 that permitted the chemical mechanical polishing of the parts of layer 210 of polycrystalline silicon situated above control gates 130, has been stripped. The removal of the silicon oxide is accomplished by employing dilute hydrofluoric acid (HF), which is very selective relative to silicon. Layer 210 protects the sidewalls of gate 130 of the control transistor during this step. The width of the sidewalls situated on both sides of gate 130 of the control transistor is then preserved by layer 210.

Figure 2G:
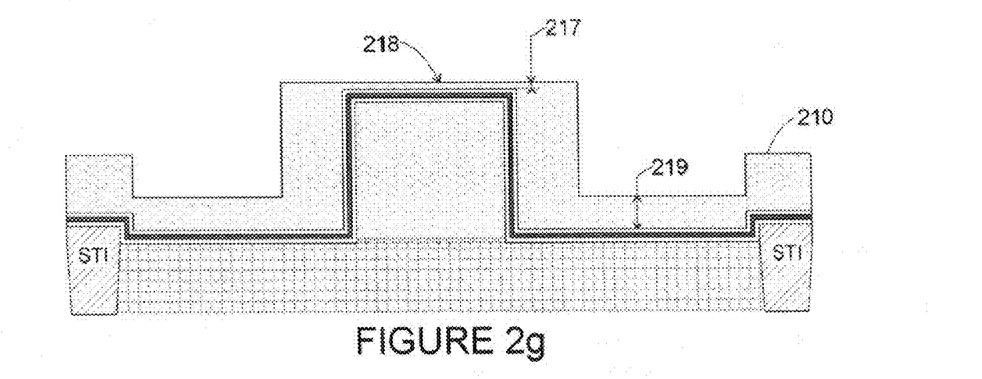
Figure 2H:
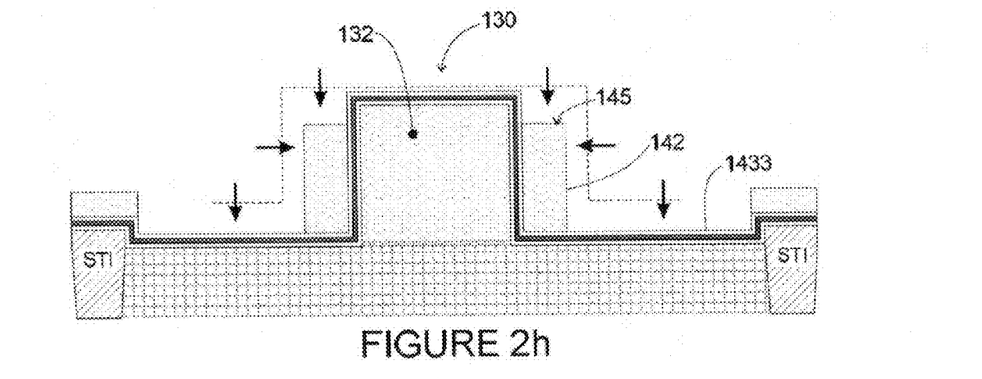

The two following figures illustrate the operations of etching of the control gate of the memory transistor in residual layer 210 of polycrystalline silicon. The etching takes place in two steps:

The result of the first etching step is illustrated by FIG. 2g. There is employed highly anisotropic etching of RIE type, the English acronym for "reactive ion etching", in other words "reactive ionic etching". This is dry etching that is commonly practiced by the microelectronics industry. It is carried out in a confinement chamber at low pressure, where a plasma is formed from electrical and/or magnetic fields. The plasma reacts physically and chemically mainly with the horizontal surfaces of the wafer that are bombarded by the high-energy ions of the plasma. This first etching step makes it possible to preserve the planarity of the surface of polycrystalline silicon 218 above the stack of layers of the control gates as well as possible, while reducing the thickness of layer 210 of polycrystalline silicon outside these zones. At the end of this first step of anisotropic etching, what remains is to remove a residual thickness 219 between the zones of control gates. Preferably only a thin thickness 217 on the order of 5 to 10 nm is left of layer 210 above the control gates. This etching is stopped in time.

The result of the second step of etching of the polycrystalline silicon that will serve to form the control gate of the memory transistor is shown in FIG. 2h. This etching step is more isotropic, and it therefore affects all the surfaces regardless of their orientation. Therefore, it will also contribute to rounding of the angles. In addition, it is selective relative to the silicon oxide that constitutes upper layer 1433 of insulator of stack 143 of ONO layers described in the foregoing. It is this layer 1433 that therefore constitutes the layer for stopping this second etching step. This etching step makes it possible to obtain patterns 142, intended to form the control gate of the memory transistor and having a large plane surface 145, making it possible to define a contact area easily on this gate. The second etching step is based on the use of chemical etching solutions based on chlorine ($Cl_2$) and fluorine (F).

FIG. 3, which comprises FIGS. 3a to 3f, describes the subsequent steps of the method of formation of the control gate of the memory transistor. These steps make it possible to finalize the structure of the memory cell having a much broader surface for definition of a contact area by virtue of the previous application of the steps described in reference to the preceding figures.

Figure 3A:
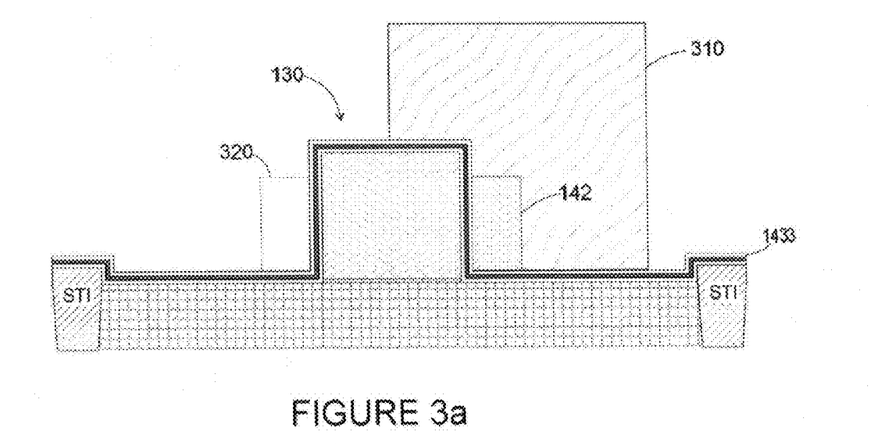
Figure 4:
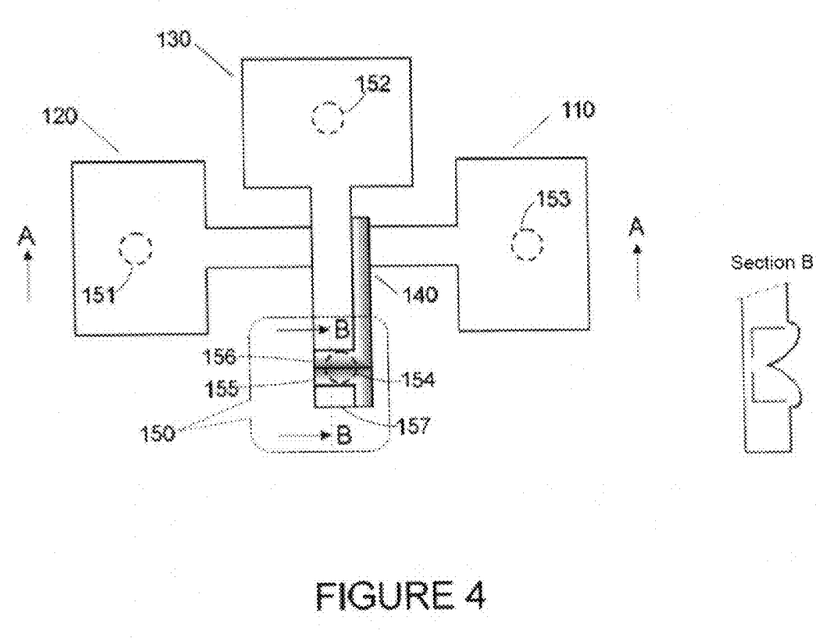
FIG. 4 illustrates a double-gate memory cell according to a particular embodiment, which may be optionally obtained by employing the method according to the invention.

FIG. 3a illustrates the step in which the zone of control gate 140 of the memory transistor that will be protected is defined. As illustrated in FIG. 4, which will be described in detail later, this figure being is a plan view of a non-limitative example of a memory cell, there is left in existence by photo etching only part of pattern 142, which has just been created from polycrystalline silicon layer 210, as explained in FIGS. 2*a* to 2*h*, and which constitutes the spacer of the gate of the control transistor. This spacer was created without lithography all around the gate of the control transistor, and it is left in existence only on one of the sidewalls to form control gate 140 of the memory transistor there. Optionally, it is possible to create a broader zone 150 for definition of a contact area, for example in the continuation of gate 130 of the control transistor, as illustrated and described with reference to FIG. 4. FIG. 3*a* shows in section the layer of photosensitive resin used by the corresponding photolithography operation after development of resin patterns 310, which will protect the part of the spacer constituted by patterns 142 which must remain in place.

At this stage, etching of the patterns obtained from layer 210 of polycrystalline silicon intended to form control gate 140 of the memory transistor is carried out in zones 320 not protected by the resin. This etching may be dry etching, very selective relative to the $SiO_2$. This etching is stopped as in the foregoing on upper layer 1433 of stack 143 of ONO layers, in other words on oxide layer 1433 in this example.

Figure 3B:
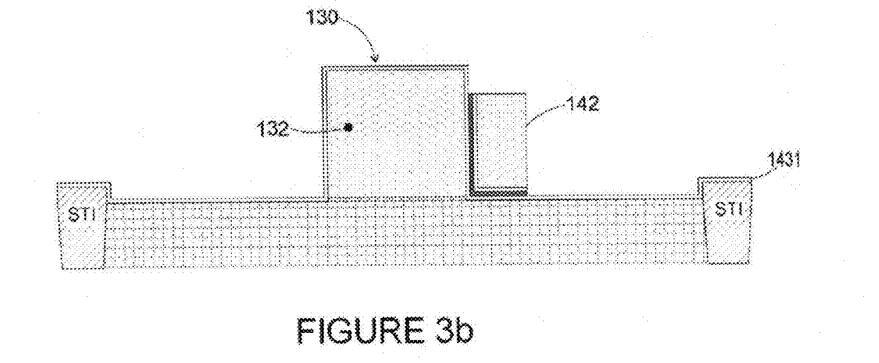

FIG. 3*b* illustrates the step in which, after removal of the resin, dry etching of the two upper layers of stack of ONO layers 143 is carried out. Upper layer of insulator 1433 (silicon oxide in this example), then intermediate layer 1432 (silicon nitride in this example) are successively etched. The etching is performed over the entire surface of the devices in the course of manufacture. Sandwich 143 of ONO layers is protected from attack in the control gate of the memory transistor by pattern 142 of polycrystalline silicon. FIG. 3*b* is a view in section at the end of this etching. Thus only lower insulator layer 1431 (silicon oxide in this example) of the ONO layer serving to stop the etching hereinabove remains in place at this stage.

Figure 3C:
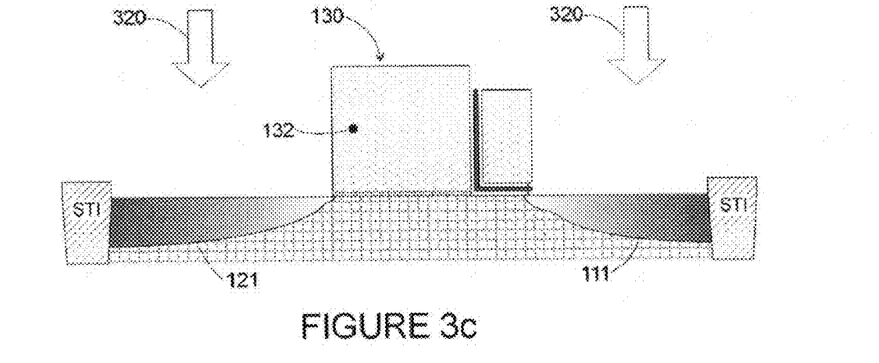

FIG. 3*c* illustrates the step of doping of source and drain zones 121 and 111 respectively. This doping is accomplished by ion implantation 320 through remaining lower insulating layer 1431 of the ONO layer that serves for protection of the underlying silicon for this operation. As represented, this layer is then removed, for example by wet etching.

Figure 3D:
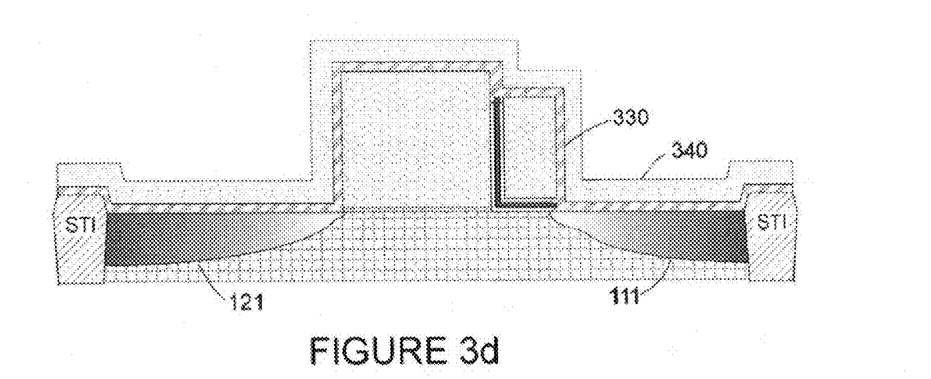
Figure 3E:
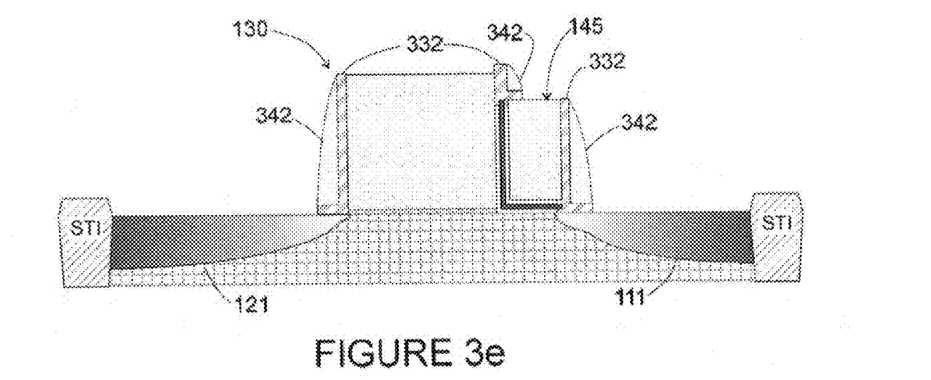

FIGS. 3*d* and 3*e* illustrate the production of spacers from patterns 142 formed in layer 210, in other words of polycrystalline silicon in this non-limitative example.

A layer 330 is then deposited. According to an advantageous example, this layer is an oxide referred to as HTO, for the English "high temperature oxide", in other words "oxide at high temperature", obtained by the LPCVD technique already mentioned in the foregoing, at a temperature, for example, of 730° C. Typically, a thickness of 10 nm is deposited. In any case, this thickness must be sufficient to fill the voids resulting from isotropic etching of the oxide layers of stack 143 of ONO layers interposed previously. This layer also makes it possible to achieve good adherence for the deposition of the subsequent layer 340, described hereinafter. Furthermore, it will serve as stop layer for etching.

As shown in FIG. 3*d*, the deposition of layer 330 is followed by deposition of a layer 340, for example of silicon nitride ($Si_3N_4$). This deposition may be achieved by the same technique as that hereinabove of low-pressure chemical vapor deposition (LPCVD). There is deposited a layer of silicon nitride that typically has a thickness ranging from 20 to 40 nm. This layer will serve to form spacers 342, which make it possible to keep the self-aligned ion implantations of the source and drain electrodes and the silicidation of the following contacts away from the selection and memory gates.

FIG. 3*e* shows the result of etching of the above layers, in other words: layer 340 of $Si_3N_4$, then layer 330 of HTO. Conventionally, the etching of these layers is highly anisotropic in a first step, in order to leave in place, on the sidewalls of the control and memory gates, patterns 332 of HTO and patterns 342 of $Si_3N_4$, which serve as gate spacers. This highly anisotropic etching is followed by more isotropic etching in order to be selective and to permit stopping of etching on the polycrystalline silicon of the control and memory gates. This second etching must be sufficient to uncover top 145 of pattern 146 serving as contact on the control gate of the memory transistor and the top of the gate of the control transistor that will be silicidated to assure good electrical contact.

Typically, at this stage, a second implantation of the electrodes of source 111 and drain 121 is also carried out in order to reduce the electrical resistance from them. This second implantation is self-limited by the gate spacers that have just been produced.

Figure 3F:
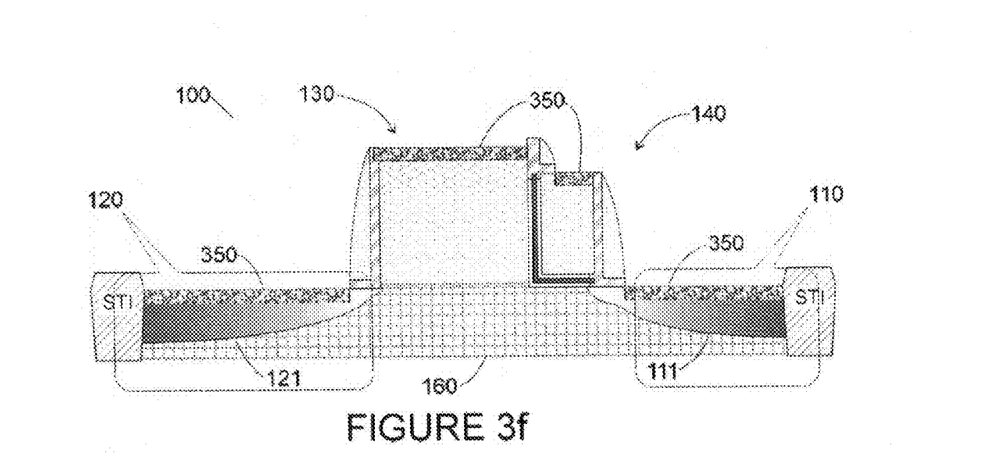

FIG. 3*f* shows zones 350 that are then silicidated in order to obtain better electrical contact with the vias, which provide access to the electrodes of the double-gate memory cell: gate 130 of the control transistor and control gate 140 of the memory transistor. Examples of such vias are illustrated in FIG. 4. Just as the second implantation hereinabove, the silicidation of the contacts is self-limited by the gate spacers.

An additional advantage of the present invention lies in the fact that the volume of semiconductor material accessible for performing the silicidation step is increased compared with the known methods. The volume of silicidated zones is therefore increased and the electrical contact is improved.

This operation completes the formation of electrodes and active elements of non-volatile double-gate memory cells 100 capable of benefiting from the method of the invention. The subsequent operations relate to the formation of all of the interconnections between the components and memory cells of a device, those referred to as "end of line" or BEOL, for the English "back end of line", which may be performed in standard manner, in particular because the definition of a contact area on the memory gate or behind the memory gate (on an even broader zone) is much broader, and so it is not necessary to be able to position the corresponding vias with greater precision.

FIG. 4 illustrates a plan view of a particular and non-limitative example of the invention of a double-gate memory cell. This plan view shows the four electrodes controlling the memory point. It will be noted here that FIGS. 1*a* and 1*b* are views according to section A of the memory cell, but on a different scale. This view reveals in particular source 110, drain 120 and gate 130 of the control transistor. Source 110, drain 120 and gate 130 of the control transistor are formed by lithography. As represented, it is possible to provide broad connection surfaces intended to receive vertical connections, in other words vias 151, 152 and 153, which assure the interconnections with the horizontal circuitry layers (not represented) of the device containing such memory cells. The cell also comprises a control gate 140 of the memory transistor. Control gate 140 of the memory transistor is formed, without having to rely on lithography, as a spacer on one of the sidewalls of gate 130 of the control transistor. The connection surface is much smaller, as already seen hereinabove. An improvement achieved by this particular memory-cell structure compared with the conventional structures consists in substantially doubling this contact surface by creating a zone 150 for defining an electrical contact area, which in this example is situated in the continuation of gate 130 of the control transistor. It is then arranged that two spacers are left in this zone, between the end of gate 130 of the control transistor and a separate pattern or block 157, preferably of the same width and same composition as gate 130 of the control transistor, at a distance such that they will be in contact as shown schematically in section B. It is in this region that a via 154 will be able to assure electrical contact with gate 130 of the control transistor. In practice, such a zone for defining a contact area is fully useful only if a rounded or plane shape of the spacer can also be obtained at the same time, as in the example of FIG. 1b.

In general, the memory cell, a particular example of which is represented in FIG. 4, may have the following characteristics. It comprises at least:
- an active zone formed in a layer of semiconductor and having a channel disposed between a source 110 and a drain 120,
- a first gate disposed at least on a first part of the channel,
- at least one portion 155 of a first lateral spacer disposed against at least one lateral sidewall of the first gate, one part of which forms a second gate disposed on at least one second part of the channel, one among the first or the second gates additionally containing a stack of layers 143, of which at least one of the said layers is capable of storing electrical charges. Preferably, the first gate forms gate 130 of the control transistor and the second gate forms control gate 140 of the memory transistor.

Preferably, the memory cell additionally has at least one portion of a second lateral spacer disposed against at least one lateral sidewall of a block 157 disposed on the semiconductor layer, the second lateral spacer being in contact with the first lateral spacer, the first the second lateral spacers being composed of similar materials, the said portion of the second lateral spacer forming at least part of a contact dot.

Optionally, in this example, a portion 156 is connected electrically to the second gate. This portion 156 is disposed against two lateral sidewalls of the first gate that are separate and perpendicular relative to one another. The electrical contact dot, or surface for definition of a contact area, is formed here by this portion of spacer 156 and the portion of spacer 155 formed against block 157, and it is disposed in the continuation of the first gate. Such an alternative embodiment has in particular the advantage that it can approach the electrically conductive lines intended to be formed to contact the first gate and the second gate, in this way making it possible to increase the density of a memory device formed from a matrix of memory cells.

This double-gate electronic memory cell makes it possible to achieve definition of an electrical contact area for each of the gates with a reduced risk of short circuit between the gates. This structure makes it possible to relax somewhat the constraints associated with the alignment of electrical contacts compared with the gates of the memory cell, and without having to employ a supplementary photolithography level dedicated to this definition of an electrical contact area.

However, it has been proved that, in practice, the definition of a contact area for this type of cell is really facilitated and the risks of short circuits are significantly reduced only if a rounded or substantially plane shape of the spacer can be obtained, as in the example of FIG. 1b.

The method according to the invention, a particular example of which is described with reference to FIGS. 2a to 3f, makes it possible to obtain this type of shape. The invention therefore makes it possible considerably to facilitate the definition of a contact area, and this for varied structures of memory cells, in the structure described hereinabove, an example of which is illustrated in FIG. 4, not being limitative of the invention. The method according to the present invention, applied to a memory cell having a structure such as described in the paragraphs containing reference to FIG. 4, makes it possible to achieve particularly advantageous results.

The invention is not limited to merely the exemplary embodiments described in the foregoing, and extends to any embodiment in conformity with its spirit.

In particular, the invention is not limited to one layer 210 of polycrystalline silicon. This layer also may be constituted of any other semiconductor material or of a stack of layers comprising a semiconductor material. Similarly, the invention is not limited to a layer 220 of SiO2. This layer also may be constituted of any other material that is easy to deposit, that can be planarized by a method of CMP type (chemical mechanical polishing) and that can be removed by a chemical solution.

In view of the foregoing description, it is therefore clearly apparent that the present invention makes it possible to obtain a double-gate electronic memory cell making it possible to define an electrical contact area for each of the gates without necessitating ultra precise alignment of the electrical contacts relative to the gates, and limiting the risk of short circuit between the latter.

The invention claimed is:

1. A method of making a non-volatile double-gate memory cell comprising a control transistor comprising a gate and a memory transistor comprising a control gate adjacent to the gate of the control transistor, wherein the method comprises the steps of:
- forming at least partly the gate of the control transistor, comprising obtaining a relief of a semiconductor material on a substrate;
- forming the control gate of the memory transistor, comprising a step of depositing a layer of a semiconductor material so as to cover at least the relief of the gate of the control transistor;
- wherein said forming of the control gate of the memory transistor additionally comprises the following steps:
  - depositing, on the layer of semiconductor material, another layer having a thickness such that the upper face of said other layer is situated at all points above the relief of the gate of the control transistor;
  - chemical mechanical polishing (CMP) performed so as to strip, above the relief of the gate of the control transistor, said other layer and part of the layer of a semiconductor material;
  - stripping of the remaining said other layer on both sides of the relief of the gate of the control transistor,
  - etching of the layer of a semiconductor material so as to strip this material above the relief of the gate of the control transistor and to leave only a pattern on at least one sidewall of the relief of the gate of the control transistor.

2. A method according to claim 1, wherein the step of chemical mechanical polishing comprises a first step of chemical mechanical polishing carried out so as to substantially planarize the surface of said other layer.

3. A method according to claim 2, wherein the step of chemical mechanical polishing comprises a second step of chemical mechanical polishing carried out so as to reduce the thickness of the layer of a semiconductor material situated above the relief of the gate of the control transistor.

4. A method according to claim 1, wherein the step of chemical mechanical polishing is carried out so as to strip approximately 20% of the thickness of the layer of a semiconductor material.

5. A method according to claim 1, wherein the etching step comprises in particular an anisotropic etching of the layer of a semiconductor material.

6. A method according to claim 5, wherein the step of anisotropic etching is carried out so as to preserve, above the relief of the gate of the control transistor, a thickness of the layer of a semiconductor material between 5 and 10 nm.

7. A method according to claim 5, wherein the etching step comprises, after the anisotropic etching, an isotropic etching of the remaining layer of a semiconductor material, wherein the etching is stopped on an upper oxide layer and wherein the upper oxide layer is disposed on the relief of the gate of the control transistor prior to the deposition of the layer of a semiconductor material.

8. A method according to claim 1, wherein the step of depositing the layer of a semiconductor material is carried out so that the thickness of the layer of a semiconductor material as deposited is between 0.2 and 0.8 times the thickness of the relief of the gate of the control transistor.

9. A method according to claim 8, wherein the thickness of the layer of a semiconductor material is substantially equal to half the thickness of the silicon of the relief of the gate of the control transistor.

10. A method according to claim 9, wherein the thickness of the layer of a semiconductor material is smaller than the thickness of the said other layer.

11. A method according to claim 1, wherein the step of depositing the layer of a semiconductor material is carried out so that the thickness of the layer of a semiconductor material is substantially constant.

12. A method according to claim 1, wherein the step of depositing said other layer is carried out so that its thickness is greater than 1.1 times the thickness of the relief of the gate of the control transistor.

13. A method according to claim 12, wherein the thickness of said other layer is greater than 1.3 times the thickness of the relief of the gate of the control transistor.

14. A method according to claim 1, wherein the relief of the gate of the control transistor is of polycrystalline silicon.

15. A method according to claim 1, wherein the layer of a semiconductor material is of polycrystalline silicon.

16. A method according to claim 1, wherein said other layer is of silicon dioxide ($SiO_2$).

17. A method according to claim 1, wherein the control gate of the memory transistor forms a spacer for the gate of the control transistor.

18. A method according to claim 1, wherein the formation of the control gate of the memory transistor is carried out so that the control gate of the memory transistor is self-aligned with the gate of the control transistor.

19. A method according to claim 1, comprising, prior to the step of depositing the layer of a semiconductor material, a step of forming a stack of layers on at least one sidewall of the relief of the gate of the control transistor and at least one part of the substrate, the stack of layers being configured to store electrical charges.

20. A method according to claim 1, comprising a step of silicidating an upper surface of the pattern.

21. A non-volatile double-gate memory cell comprising:
a control transistor comprising a gate and a memory transistor comprising a control gate adjacent to the gate of the control transistor, the gate of the control transistor comprising a relief of a semiconductor material on a substrate, and
the control gate of the memory transistor being formed by depositing a layer of a semiconductor material so as to cover at least the relief of the gate of the control transistor; depositing, on the layer of semiconductor material, another layer having a thickness such that the upper face of said other layer is situated at all points above the relief of the gate of the control transistor chemical mechanical polishing (CMP) performed so as to strip, above the relief of the gate of the control transistor, said other layer and part of the layer of a semiconductor material; stripping of the remaining said other layer on both sides of the relief of the gate of the control transistor, etching of the layer of a semiconductor material so as to strip this material above the relief of the gate of the control transistor and to leave only a pattern on at least one sidewall of the relief of the gate of the control transistor.

* * * * *

UNITED STATES PATENT AND TRADEMARK OFFICE
CERTIFICATE OF CORRECTION

| | |
|---|---|
| PATENT NO. | : 8,906,765 B2 |
| APPLICATION NO. | : 13/736578 |
| DATED | : December 9, 2014 |
| INVENTOR(S) | : Christelle Charpin-Nicolle |

It is certified that error appears in the above-identified patent and that said Letters Patent is hereby corrected as shown below:

In the claims,

Column 15, line 26, Claim 10 change "thickness of the said other layer." to --thickness of said other layer.--.

Column 16, line 30, Claim 21 change "transistor chemical mechanical" to --transistor; chemical mechanical--.

Signed and Sealed this
Twenty-seventh Day of October, 2015

Michelle K. Lee
*Director of the United States Patent and Trademark Office*